United States Patent
Heil et al.

(10) Patent No.: US 11,031,931 B2
(45) Date of Patent: Jun. 8, 2021

(54) METHOD FOR PROTECTING A SEMICONDUCTOR SWITCH, PROTECTIVE DEVICE FOR A SEMICONDUCTOR SWITCH, AND CONTROL CIRCUIT FOR A SEMICONDUCTOR SWITCH

(71) Applicant: Robert Bosch GmbH, Stuttgart (DE)

(72) Inventors: Matthias Heil, Hessigheim (DE); Peter Sinn, Untergruppenbach (DE); Sebastian Laich, Stuttgart (DE); Tobias Richter, Bietigheim-Bissingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 365 days.

(21) Appl. No.: 16/097,288

(22) PCT Filed: Mar. 9, 2017

(86) PCT No.: PCT/EP2017/055526
§ 371 (c)(1),
(2) Date: Apr. 1, 2019

(87) PCT Pub. No.: WO2017/186394
PCT Pub. Date: Nov. 2, 2017

(65) Prior Publication Data
US 2019/0245531 A1    Aug. 8, 2019

(30) Foreign Application Priority Data
Apr. 29, 2016  (DE) ..................... 10 2016 207 384.2

(51) Int. Cl.
*H02H 9/00* (2006.01)
*H03K 17/082* (2006.01)
*H02H 1/00* (2006.01)

(52) U.S. Cl.
CPC ....... *H03K 17/0828* (2013.01); *H02H 1/0007* (2013.01); *H02H 9/00* (2013.01)

(58) Field of Classification Search
CPC ...... H02H 9/00; H02H 9/04–06; H02H 1/007; H01L 23/62; H03K 17/08;
(Continued)

(56) References Cited

U.S. PATENT DOCUMENTS

2012/0200320 A1    8/2012  Thalheim et al.
2013/0249606 A1*   9/2013  Ikeda ................. H03K 17/0822
                                              327/109

FOREIGN PATENT DOCUMENTS

DE    102010008815 A1 *  8/2011  ......... H03K 17/0828
DE    102010008815 A1     8/2011
(Continued)

OTHER PUBLICATIONS

Ruedi, H. et al., "Scale Driver for Hight Voltage IGBTs", Power Conversion, Jun. 1999, Proceedings 367, CT-Concept Technologies AG, Leubringen/Evilard, Switzerland, (7 pages).

*Primary Examiner* — Thienvu V Tran
*Assistant Examiner* — Ivan Laboy
(74) *Attorney, Agent, or Firm* — Michael Best & Friedrich LLP

(57) ABSTRACT

A protective device for protection of a semiconductor switch against overvoltages during a deactivation process. A compensation signal is provided at an input of a driver stage for a semiconductor switch to be deactivated if the voltage at the output of the semiconductor switch exceeds a specified threshold, and simultaneously a request to open the semiconductor switch is detected at an input of the driver stage for the semiconductor switch. The compensation signal is limited to a specified duration. On the basis of the compensation signal provided in the aforementioned manner, the driver stage for the semiconductor switch partly controls the (Continued)

semiconductor switch in order to prevent an excessively quick opening of the semiconductor switch.

11 Claims, 3 Drawing Sheets

(58) Field of Classification Search
CPC .......................... H03K 17/0812–08128; H03K 17/0814–08148; H03K 17/082–0828
USPC .............................. 361/86, 88, 90, 91.1–91.8
See application file for complete search history.

(56) References Cited

FOREIGN PATENT DOCUMENTS

| WO | 03085832 A1 | 10/2003 |
| WO | 2014127872 A1 | 8/2014 |

\* cited by examiner

METHOD FOR PROTECTING A SEMICONDUCTOR SWITCH, PROTECTIVE DEVICE FOR A SEMICONDUCTOR SWITCH, AND CONTROL CIRCUIT FOR A SEMICONDUCTOR SWITCH

BACKGROUND OF THE INVENTION

The present invention relates to a protective device for a semiconductor switch and a method for protecting a semiconductor switch, and to a control circuit for a semiconductor switch. In particular, the present invention relates to the protection of a semiconductor switch against overvoltages.

In the operation of semiconductor switches, in particular of power semiconductor switches, a short-term increase in the voltage across the switch can occur when the semiconductor switch is opened under load. Such voltage increases are unavoidable, for example, due to inductive loads in a load circuit or a commutation circuit when PWM inverters are used.

In order not to exceed permissible blocking voltages of a semiconductor switch, suitable protective circuits are therefore required, which limit the switching speed, for example, and thus, by limiting the rate of current change over time (dI/dt), counteract an excessive voltage increase across the semiconductor switch.

DE 10 2010 008 815 A1 discloses an overvoltage protector for a semiconductor switch. In this case, the overvoltage protection is only enabled when the semiconductor switch is turned off. In the active state of the overvoltage protector, a current through a Zener diode is used to turn on the semiconductor switch temporarily. In the inactive state of the overvoltage protector, the current is diverted through the Zener diode, without having any effect on the semiconductor switch.

SUMMARY OF THE INVENTION

The present invention creates a protective device for a semiconductor switch, a control circuit for a semiconductor switch and a method for protecting a semiconductor switch.

Accordingly, the following are provided:

A protective device for a semiconductor switch, which can be controlled by a driver stage, with an overvoltage detector, a limiting element, a control circuit and a compensation circuit. The overvoltage detector is electrically coupled to an output of the semiconductor switch. The overvoltage detector is designed to provide an overvoltage signal when an electrical voltage at the output of the semiconductor switch exceeds a predetermined threshold. The limiting element is designed to limit the overvoltage signal provided by the overvoltage detector to a predetermined duration. The time-limited overvoltage signal is provided at an output terminal of the limiting element. The activation circuit is designed to enable an electrical connection between the overvoltage detector and the limiting element if a predetermined control signal is present at an input of the driver stage for the semiconductor switch. For this purpose, the activation circuit can be designed to detect the predetermined control signal at the input of the driver stage. The compensation circuit is electrically connected to the output terminal of the limiting element. The compensation circuit is designed to provide a compensation signal at an input of the driver stage for the semiconductor switch as a function of the overvoltage signal that is time-limited by the limiting element.

Also provided are:

A control circuit for a semiconductor switch with a driver stage and a protective device according to the invention for the semiconductor switch. The driver stage comprises at least one output terminal and at least one input terminal. The driver stage is designed to provide a control signal at the output terminal of the driver stage for the semiconductor switch as a function of an input signal provided at the input terminal.

Also provided are:

A method for protecting a semiconductor switch, which can be controlled by a driver stage. The method comprises a step of providing an overvoltage signal when a predetermined voltage is exceeded at a terminal of the semiconductor switch. The method also comprises a step of detecting a predetermined control signal at the input of the driver stage and a step of enabling the overvoltage signal when the predetermined control signal is detected at the input of the driver stage. The method also comprises a step of limiting the enabled overvoltage signal to a maximum duration and a step of providing a compensation signal at an input terminal of the driver stage for the semiconductor switch as a function of the time-limited overvoltage signal.

The present invention is based on the recognition that a fast disconnection of loads, in particular inductive loads, can cause excess voltages to occur on the respective switching element, which may lead to impairments and even to destruction of the switching element. Therefore, if necessary, in order to protect such switching elements suitable protection circuits must be provided, which intervene in the switching behavior if a maximum allowable voltage is exceeded. But in order that a switch can be opened completely again, a static operating voltage which is present after the end of the switching operation when the switch is opened must be less than the intervention threshold of the protection circuit.

Therefore, an idea of the present invention is to recognize this fact and to provide an extended protection for a semiconductor switch. In particular, the core of the present invention is to combine multiple conditions to trigger a response by the overvoltage protector. Thus, a response of the overvoltage protection by means of a degenerative feedback branch is activated only when a switching-off process is actually activated, which is to say a corresponding switch-off signal is present on a driver stage, the voltage across the semiconductor switch to be protected is greater than an intervention threshold and in addition, an additional time limitation of the intervention has not yet expired. Only when all of these conditions are met is an intervention of the overvoltage protection carried out. In this case a compensation signal is provided at the driver stage for the semiconductor switch to be protected in order to control the semiconductor switch to be protected, at least in part, and thus to limit the current change during the switch-off process. Thus, in most cases it is possible to limit the voltage drop across the semiconductor switch to be protected and thus to keep it at an almost constant level until the completion of the switching-off operation.

The current change over time is normally produced automatically, so that the permissible blocking voltage range of the semiconductor switch to be protected is used in an optimal way. Usually, an almost constant current change per unit time can be achieved.

The intervention of the overvoltage protection then takes place on the input side of the driver stage. In this way, no direct supply of compensation voltages to the control terminal of the semiconductor switch is necessary. This means driver-internal transverse currents can be avoided. This leads to a decreased loading of the driver stage during the intervention.

According to one embodiment, the overvoltage detector comprises an avalanche diode or a Zener diode. In particular, the overvoltage detector can comprise a series circuit consisting of a conventional semiconductor diode and an avalanche diode or Zener diode with opposite forward directions. This enables a voltage signal for protecting the semiconductor switch to be provided in a simple and reliable way.

According to one embodiment the limiting element comprises a high-pass filter. In particular, the limiting element can comprise an R-C element. The capacitance of the R-C-element or the high-pass filter can be arranged in the signal path of the overvoltage signal. In this way, a simple and reliable time limitation of the overvoltage signal can be implemented.

According to one embodiment, the activation circuit is designed to enable the electrical connection between the overvoltage detector and the limiting element, as a function of a comparison of voltage values between an input signal of the driver stage and an output signal of the driver stage. In particular, the activation circuit can enable the overvoltage signal when a control signal for switching off the semiconductor switch to be protected is present at the input of the driver stage. In this way, a request to switch off the semiconductor switch to be protected can be detected, and the response of the protective device can be limited to such a deactivation of the semiconductor switch.

In accordance with an embodiment of the control circuit for the semiconductor switch the driver stage of the control circuit comprises at least two transistors, each of which is electrically coupled to the output terminal of the driver stage with one terminal.

According to one embodiment the protective device comprises a diode which is arranged between the output terminal of the compensation circuit and the control terminal of the semiconductor switch. In particular, the diode can be arranged in anti-parallel between a control terminal and an output terminal of a transistor of a driver stage for the semiconductor switch. This method enables an especially fast response of the protective device for the semiconductor switch to be achieved.

In accordance with one embodiment of the method for protecting a semiconductor switch the step of enabling the overvoltage signal enables the overvoltage signal when a control signal to close the semiconductor switch is present at the input of the driver stage. In addition, the step of providing the compensation signal at the input of the driver stage provides a compensation signal which is designed to control the semiconductor switch, at least in part. In this way, the control of the semiconductor switch with the compensation signal can be used to slow down an excessively fast opening of the semiconductor switch, in order to limit the maximum change in current through the semiconductor switch and thus prevent a dangerous voltage rise across the semiconductor switch.

Where practical, the above embodiments and extensions can be combined with each other in any way desired. Further embodiments, extensions and implementations of the invention also comprise combinations of features of the invention either described previously or in the following in relation to the exemplary embodiments, which are not explicitly mentioned. In particular, the person skilled in the art will also be able to add individual aspects as improvements or additions to the basic forms of the invention.

BRIEF DESCRIPTION OF THE DRAWINGS

The present invention is described in more detail hereafter with the aid of the exemplary embodiments given in the schematic Figures of the drawings. These show.

DETAILED DESCRIPTION

Figure 1:
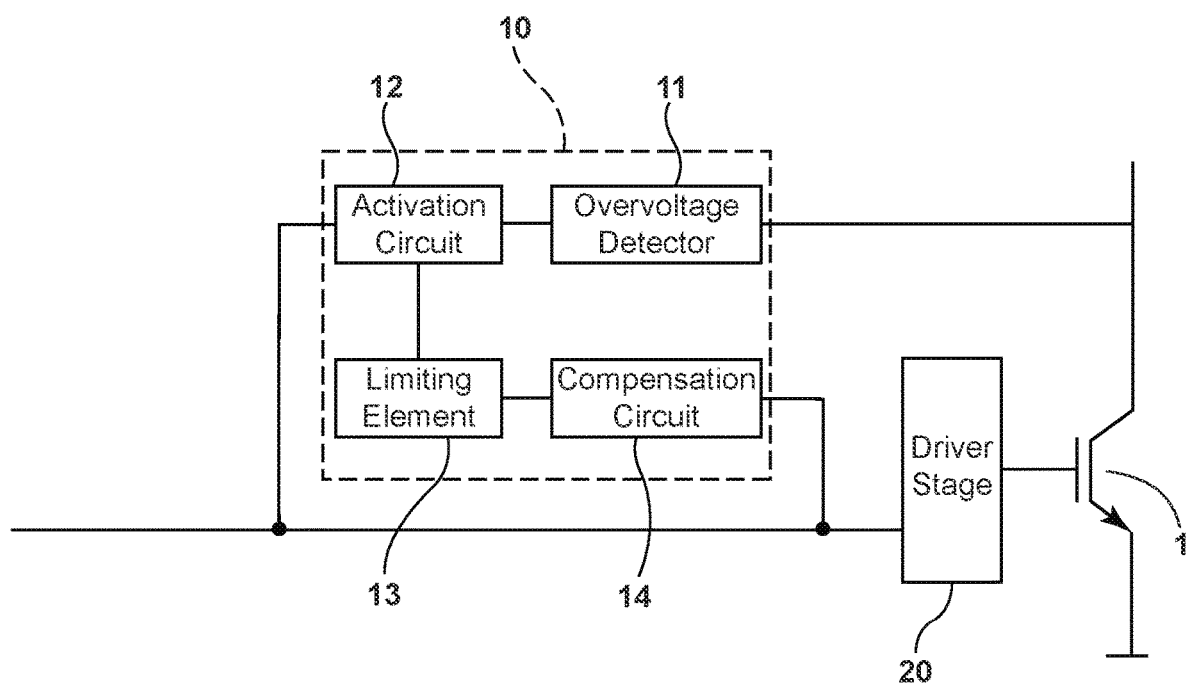
FIG. 1: a schematic representation of a control device for a semiconductor switch with a protective device according to one embodiment.

In all figures, identical or functionally equivalent elements and devices are labelled with the same reference numeral, unless otherwise indicated.

Semiconductor switches within the meaning of the present invention are essentially all types of switching elements, in which an electrical connection can be opened or closed on the basis of a semiconductor structure. The opening and closing of the semiconductor switch is accomplished by controlling the semiconductor switch by means of an electrical signal. For example, semiconductor switches can comprise MOSFET or bipolar transistors with an insulated gate terminal (IGBT). Furthermore, the protective device according to the invention can also be applied to all other types of semiconductor switches.

Although the protective device described below in more detail is described in connection with semiconductor switches, it is additionally equally applicable to other switching elements, in which protection against overvoltage when closing the switching element is to be achieved.

FIG. 1 shows a schematic representation of a control circuit for a semiconductor switch 1 according to one embodiment. The semiconductor switch 1 to be protected comprises a control terminal in addition to an input terminal and an output terminal. This control terminal is electrically coupled to a driver stage 20. The driver stage 20 provides an electrical signal at the control terminal of the semiconductor switch 1, which is suitable for controlling the semiconductor switch 1. In order to control the semiconductor switch 1, an input signal can be connected to one or more input terminals of the driver stage 20. Based on this input signal, the driver stage 20 generates an output signal, which is suitable for controlling the semiconductor switch 1 in an appropriate way. The input signal which can be provided at the driver stage 20 can be, for example, a digital signal, wherein in the event of a first value of this input signal the semiconductor switch 1 is opened and in the event of a second value of the input signal the semiconductor switch 1 is closed. Alternatively, it is also conceivable that the driver stage 20 comprises a plurality of input terminals. In this case, for example, the semiconductor switch 1 is closed when a control signal is applied to a first input terminal of the driver stage 20. If, on the other hand, a suitable input signal is applied at another input terminal of the driver stage 20, then the driver stage 20 can apply an output signal at the control terminal of the semiconductor switch 1 to open the semiconductor switch 1. In addition, any other configurations for controlling the semiconductor switch 1 by means of the driver stage 20 are also conceivable.

If the semiconductor switch 1 is closed, for example, an electrical current can flow through the semiconductor switch 1 and a load (not shown here) which is connected to the semiconductor switch 1. If the semiconductor switch 1 is then opened, with an appropriate load possibly between the input terminal and the output terminal of the semiconductor switch 1, a voltage overshoot can then be caused as a result of the rapid current decrease through the semiconductor switch 1. Without additional protective measures this voltage overshoot can cause damage to the semiconductor switch 1.

To avoid such excess voltages a protective device 10 is provided. The protective device 10 comprises an overvoltage detector 11, an activation circuit 12, a limiting element 13, and a compensation circuit 14. The overvoltage detector 11 is electrically connected to the output of the semiconductor switch 1. An additional terminal of the overvoltage detector 11 is electrically connected to the activation circuit 12. The activation circuit 12 is additionally connected to the limiting element 13. In addition, the limiting element 13 is connected to the compensation circuit 14. The compensation circuit 14 is additionally electrically connected to at least one input terminal of the driver stage 20. In addition, the activation circuit 12 can be connected to at least one input terminal of the driver stage 20. If appropriate, the activation circuit 12 can also be connected to at least one output terminal of the driver stage 20.

If the electrical voltage at the output of the semiconductor switch 1, which is connected to the overvoltage detector, exceeds a predefined threshold, then the overvoltage detector 11 supplies an overvoltage signal at the output connected to the activation circuit 12.

The activation circuit 12 monitors the input signal or input signals present at the input terminal or input terminals of the driver stage 20. If in doing so the activation circuit 12 detects that in accordance with the input signal or signals at the driver stage 20 the semiconductor switch 1 is to be opened, then the activation circuit 12 enables the overvoltage signal supplied by the overvoltage detector 11, so that the overvoltage signal provided by the overvoltage detector 11 is applied to the terminal of the limiting element 13, which is connected to the activation circuit 12. In other words, the overvoltage signal of the overvoltage detector 11 is provided to the limiting element 13 only if the activation circuit 12 detects a control signal at the input in the driver stage 20, which is intended to open the semiconductor switch 1.

The limiting element is 13 then forwards the enabled overvoltage signal first to the compensation circuit 14. The forwarding of the overvoltage signal is limited to a predetermined duration, however. After the expiry of this predetermined period, the limiting element 13 prevents the forwarding of the overvoltage signal to the compensation circuit 14.

As long as the compensation circuit 14 receives an overvoltage signal from the limiting element 13, the compensation circuit 14 outputs a compensation signal in response. This compensation signal can be supplied to one or more inputs of the driver stage 20. This compensation signal is configured in such a way that this compensation signal causes the driver stage 20 to provide a control signal at the control terminal of the semiconductor switch 1, which controls the semiconductor switch 1, at least in part, in other words switches it into an at least partially conductive state.

The compensation signal provided at the input of the driver stage 20 by the compensation circuit 14 thus leads to the fact that the semi-conductor switch 1 does not transfer to a fully open state, but a limited current flow through the semiconductor switch 1 is maintained. This reduces the rate of change of the current (dI/dt). Consequently the voltage overshoot, which may be induced by an inductive load connected to the semiconductor switch 1, is also reduced.

However, the activation of the semiconductor switch 1 via the driver stage 20 as a result of the compensation signal output by the compensation circuit 14 only takes place as long as the activation circuit 12 detects an input signal to the driver stage 20 that causes the semiconductor switch 1 to open. In addition, the limiting element 13 also limits the duration of the forwarding of the overvoltage signal by the overvoltage detector 12. After the expiry of the time limit provided by the limiting element 13 and/or the removal of the enabling condition for the activation circuit 12, no further compensation signal is provided by the compensation circuit 14.

Figure 2:
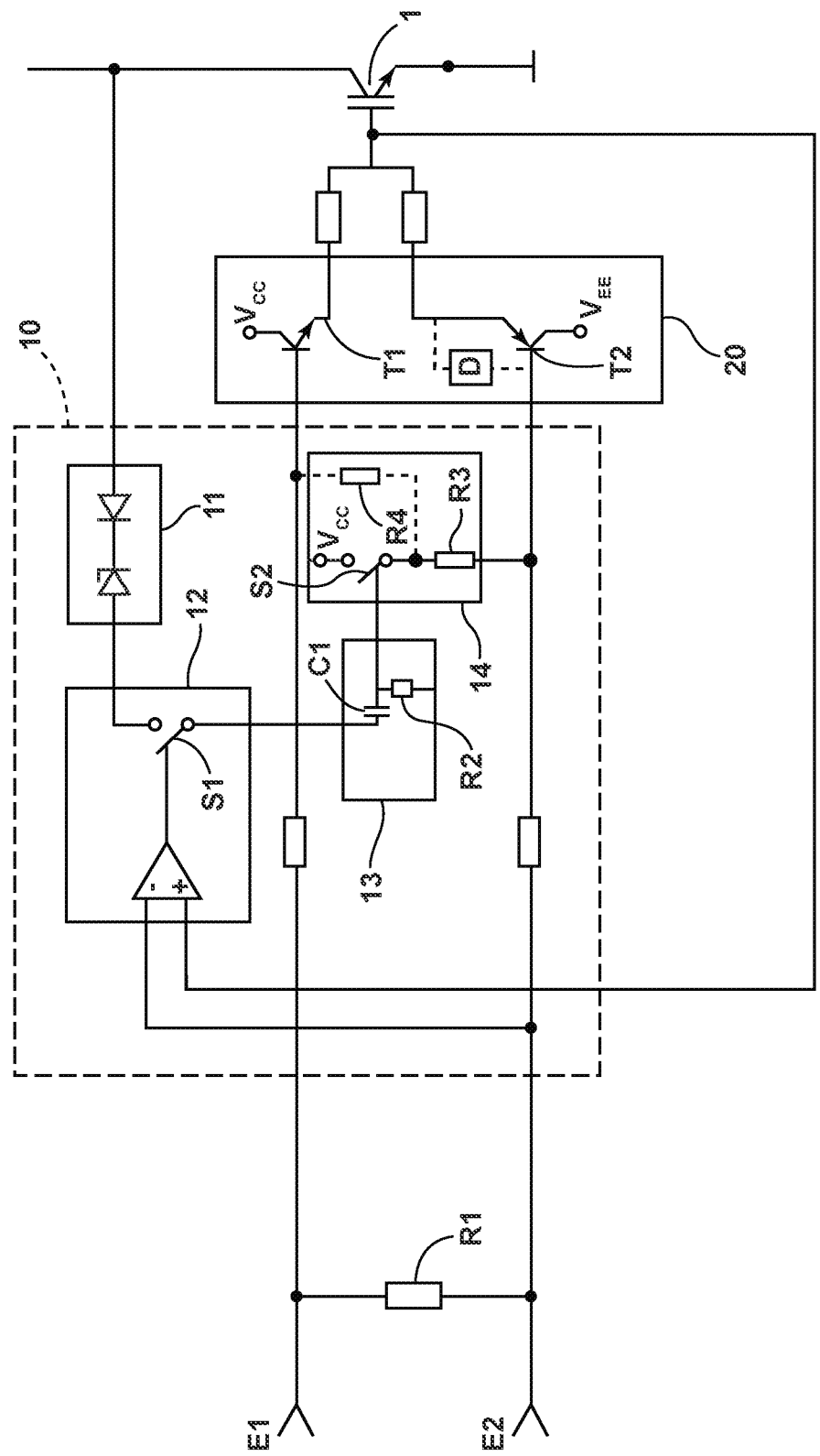
FIG. 2: a schematic representation of a control for a semiconductor switch with a detailed circuit example of a protective device according to one embodiment.

FIG. 2 shows a schematic representation of an example of a control circuit of a semiconductor switch 1 having a protective device 10 in accordance with an exemplary embodiment.

The driver stage 20 in this example comprises two input terminals E1 and E2. As appropriate, these two input terminals can be connected to each other via a suitably dimensioned electrical resistance R1. If, for example, a positive voltage, for example with roughly the same level as a gate driver supply voltage $V_{CC}$, is applied to the input terminals of the driver stage 20, then a driver signal will be provided by the driver stage 20 at the control terminal of the semiconductor switch 1, which transfers the semiconductor switch 1 into an electrically conductive state. If, on the other hand, a negative voltage, for example of roughly the same level as the negative gate driver supply voltage $V_{EE}$, is provided at the inputs of the driver stage 20, then the driver stage 20 generates a control signal that transfers the semiconductor switch into an electrically non-conductive state.

The driver stage 20 can comprise, for example, two transistors T1 and T2, wherein a control terminal of a transformer is electrically coupled to an input terminal of the driver stage 20 in each case. When a first transistor T1 is activated, for example, the positive gate driver supply voltage $V_{CC}$ can be passed through to the control terminal of the semiconductor switch 1. When the second transistor T2 is activated, alternatively, the negative gate driver supply voltage $V_{EE}$ can be passed through to the control terminal of the semiconductor switch 1.

The activation circuit 12 can compare a driver signal at the output of the driver stage 20 with a control signal at an input to the driver stage 20. If the result of the evaluation of these signals, in particular the evaluation of the input signal of the driver stage 20, is that the semiconductor switch 1 should be opened, then the activation circuit 12 can close an electrical connection between the overvoltage detector 11 and the limiting element 13. This can be carried out using any suitable electrical switching element S1. In particular, the electrical connection can be implemented, for example, by means of a suitable transistor or other semiconductor switching element. The overvoltage detector 11 between the output of the semiconductor switch 1 and the activation circuit 12 can be, for example, an avalanche diode or a Zener diode. In particular, the overvoltage detector 11 can also be implemented by a series connection of an avalanche diode or a Zener diode with a conventional diode with the opposite forward direction. In principle, however, further circuit arrangements are also possible for detecting an overvoltage at the output of the semiconductor switch 1.

The limiting element 13 is used to limit the duration of an overvoltage signal from the overvoltage detector 11, which is enabled by the activation circuit 12. To this end, the limiting element 13 can be implemented in the form of a high-pass filter, for example. In particular, the limiting element 13 can be implemented in the form of an R-C circuit consisting of the capacitor C1 and the resistor R2.

Based on the time-limited overvoltage signal, a compensation signal can be generated in the compensation circuit 14. For example, this can be achieved by activating a switching element S2 in the compensation circuit 14 to apply the positive gate driver supply voltage $V_{CC}$ via a resistor R3 to at least one input terminal of the driver stage 20. As shown in FIG. 2, in particular the lower transistor T2, which is coupled to the negative gate driver supply voltage $V_{EE}$, can be controlled with the compensation signal from the compensation circuit 14. Optionally, the compensation signal can also be provided via a further resistor R4 to another input terminal of the driver stage 20, in order to also activate the upper transistor T1, for example, which is connected to the positive gate driver supply voltage $V_{CC}$.

Optionally, a diode D can also be provided between the base terminal of the lower transistor T2 and the emitter terminal of the lower transistor T2. In this case the anode of the diode is connected to the emitter terminal of the transistor T2. This emitter terminal of the transistor T2 is additionally connected to the control terminal of the semiconductor switch 1 via a resistor. The cathode of the diode is connected to the base terminal of transistor T2. This base terminal of the transistor is connected to the resistor R3 of the compensation circuit 14. Such a diode allows a particularly rapid response of the overvoltage protector for the semiconductor switch 1.

By means of the compensation signal, which in the case described here is generated from a positive voltage such as the positive gate driver supply voltage $V_{CC}$, which is provided to the input or inputs of the driver stage 20 via one or more resistors, it is possible to counteract an immediate opening of the semiconductor switch 1, so that a limited current flow is maintained through the semi-conductor switch 1 for a temporary period.

Figure 3:
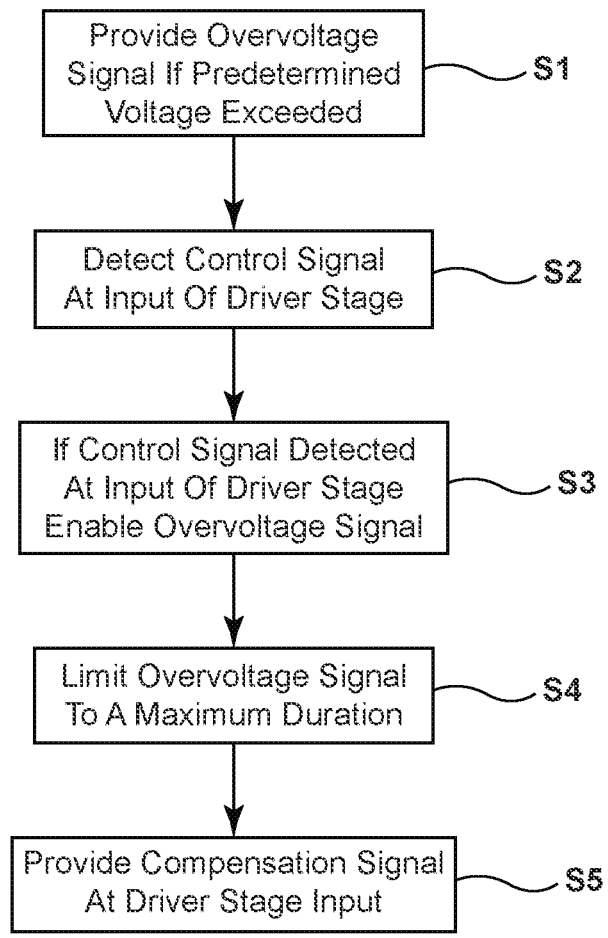
FIG. 3: a schematic representation of a sequence diagram, such as forms the basis of a method for protecting a semiconductor switch according to one embodiment.

FIG. 3 shows a schematic representation of a sequence diagram, such as forms the basis of a method for protecting a semiconductor switch according to one embodiment.

In step S1 an overvoltage signal is provided if a predetermined voltage is exceeded at a terminal of the semiconductor switch 1. In step S2 a predetermined control signal is detected at the input of a driver stage 20 for the semiconductor switch 1. If such a predetermined control signal, in particular a control signal to open the semiconductor switch, is detected at the input of the driver stage 20, then the supplied overvoltage signal is enabled.

This enabled overvoltage signal is limited to a predetermined maximum duration in step S4. Finally, in step S5 a compensation signal is provided at an input terminal of the driver stage 20 for the semiconductor switch 1. The compensation signal is provided as a function of the time-limited voltage signal. The compensation signal provided at the driver stage 20 input is configured in particular in such a way that the driver stage 20 at least partly controls the semiconductor switch 1.

In summary, the present invention relates to a protection of a semiconductor switch against overvoltages during a switching-off process. At an input of a driver stage for a semiconductor switch to be turned off, a compensation signal is provided if the voltage at the output of the semiconductor switch exceeds a predefined threshold, and if a request to open the semiconductor switch is detected at an input of the driver stage for the semiconductor switch at the same time. This compensation signal is limited to a specified duration. Based on the compensation signal thus provided, the driver stage for the semiconductor switch partially activates the semiconductor switch in order to prevent an excessively rapid opening of the semiconductor switch.

The invention claimed is:

1. A protective device for a semiconductor switch (1), which is configured to be controlled by a driver stage (20), the protective device comprising:
   an overvoltage detector (11), which is electrically coupled to an output of the semiconductor switch (1), and which is configured to provide an overvoltage signal when an electrical voltage at the output of the semiconductor switch (1) exceeds a predetermined threshold value;
   a limiting element (13), which is configured to limit the overvoltage signal supplied by the overvoltage detector (11) to a predetermined period of time and to provide the temporally limited overvoltage signal at an output terminal of the limiting element (13);
   an activation circuit (12), which is configured to enable an electrical connection between the overvoltage detector (11) and the limiting element (13) if a predetermined control signal is present at an input of the driver stage (20) for the semiconductor switch (1); and
   a compensation circuit (14), which is electrically coupled to the output terminal of the limiting element (13) and which is configured to provide a compensation signal at an input of the driver stage (20) for the semiconductor switch (1) as a function of the overvoltage signal that is temporally limited by the limiting element (13),
   wherein a diode is arranged between an output terminal of the compensation circuit (14) and a control terminal of the semiconductor switch (1).

2. The protective device as claimed in claim 1, wherein the overvoltage detector (11) comprises an avalanche diode or a Zener diode.

3. The protective device as claimed in claim 1, wherein the limiting element (13) comprises a high-pass filter.

4. The protective device as claimed in claim 1, wherein the limiting element (13) comprises an R-C element.

5. A protective device for a semiconductor switch (1), which is configured to be controlled by a driver stage (20), the protective device comprising:
   an overvoltage detector (11), which is electrically coupled to an output of the semiconductor switch (1), and which is configured to provide an overvoltage signal when an electrical voltage at the output of the semiconductor switch (1) exceeds a predetermined threshold value;
   a limiting element (13), which is configured to limit the overvoltage signal supplied by the overvoltage detector (11) to a predetermined period of time and to provide the temporally limited overvoltage signal at an output terminal of the limiting element (13);
   an activation circuit (12), which is configured to enable an electrical connection between the overvoltage detector (11) and the limiting element (13) if a predetermined control signal is present at an input of the driver stage (20) for the semiconductor switch (1); and
   a compensation circuit (14), which is electrically coupled to the output terminal of the limiting element (13) and which is configured to provide a compensation signal at an input of the driver stage (20) for the semiconductor switch (1) as a function of the overvoltage signal that is temporally limited by the limiting element (13),
   wherein the activation circuit (12) is configured to enable the electrical connection between the overvoltage detector (11) and the limiting element (13), as a function of a comparison of voltage values between an input signal of the driver stage (20) and an output signal of the driver stage (20).

6. The protective device as claimed in claim 5, further comprising a diode which is arranged between an output terminal of the compensation circuit (14) and a control terminal of the semiconductor switch (1).

7. The protective device as claimed in claim 5, wherein the overvoltage detector (11) comprises an avalanche diode or a Zener diode.

8. The protective device as claimed in claim 5, wherein the limiting element (13) comprises a high-pass filter.

9. The protective device as claimed in claim 5, wherein the limiting element (13) comprises an R-C element.

10. A method for protecting a semiconductor switch (1), which can be controlled by a driver stage (20), the method comprising:
   providing (Si) an overvoltage signal if a predetermined voltage is exceeded at a terminal of the semiconductor switch (1);
   detecting (S2) a predetermined control signal at an input of the driver stage (20);
   enabling (S3) the overvoltage signal if the predetermined control signal is detected at an input of the driver stage (20);
   limiting (S4) the enabled overvoltage signal to a maximum duration; and
   providing (S5) a compensation signal at the input of the driver stage (20) for the semiconductor switch (1), as a function of the temporally limited overvoltage signal,
   wherein an activation circuit (12) is configured to enable an electrical connection between an overvoltage detector (11) and a limiting element (13), as a function of a comparison of voltage values between an input signal of the driver stage (20) and an output signal of the driver stage (20).

11. The method as claimed in claim 10,
   wherein the step (S3) for enabling the overvoltage signal enables the overvoltage signal when a control signal to open the semiconductor switch (1) is present at the input of the driver stage (20); and
   in order to provide the compensation signal at the input of the driver stage (20), the step (S5) provides a compensation signal, which is designed to control the semiconductor switch (1), at least in part.

* * * * *